(12) United States Patent
Moore

(10) Patent No.: US 6,601,001 B1
(45) Date of Patent: Jul. 29, 2003

(54) FAULT-DETECTION FOR POWER LINES

(75) Inventor: Philip J. Moore, Bath (GB)

(73) Assignee: Alstom UK Ltd., Warwickshire (GB)

( * ) Notice: Subject to any disclaimer, the term of this patent is extended or adjusted under 35 U.S.C. 154(b) by 0 days.

(21) Appl. No.: 09/482,835

(22) Filed: Jan. 13, 2000

(30) Foreign Application Priority Data

Jan. 13, 1999 (GB) .......................................... 99000665

(51) Int. Cl.$^7$ .............................................. G01R 31/08
(52) U.S. Cl. .......................................... 702/59; 702/58
(58) Field of Search ..................... 702/58, 59; 324/512, 324/126, 127, 522, 523, 527; 361/62, 65, 68, 79, 81, 69, 76, 77, 80, 94

(56) References Cited

U.S. PATENT DOCUMENTS

| | | | | |
|---|---|---|---|---|
| 4,092,691 A | * | 5/1978 | Williams | 361/80 |
| 4,325,098 A | * | 4/1982 | Heller | 361/82 |
| 4,453,191 A | * | 6/1984 | Wilkinson | 361/84 |
| 4,484,245 A | * | 11/1984 | McFall | 361/68 |
| 4,499,417 A | * | 2/1985 | Wright et al. | 324/533 |
| 4,528,611 A | * | 7/1985 | Udren | 361/81 |
| 4,559,491 A | * | 12/1985 | Saha | 324/52 |
| 4,617,636 A | * | 10/1986 | Johns et al. | 364/482 |
| 4,719,580 A | * | 1/1988 | Nimmersjö | 702/59 |
| 4,725,914 A | * | 2/1988 | Garitty | 361/76 |
| 4,755,903 A | * | 7/1988 | Kotani | 361/80 |
| 4,766,549 A | * | 8/1988 | Schweitzer, III et al. | 702/59 |
| 4,857,854 A | * | 8/1989 | Matsushima | 324/512 |
| 4,922,368 A | * | 5/1990 | Johns | 361/62 |
| 5,072,403 A | * | 12/1991 | Johns | 702/59 |
| 5,455,776 A | * | 10/1995 | Novosel | 364/492 |
| 5,485,394 A | * | 1/1996 | Murata et al. | 364/483 |
| 5,608,327 A | * | 3/1997 | Jones et al. | 324/522 |
| 5,661,664 A | * | 8/1997 | Novosel et al. | 364/492 |
| 5,773,980 A | * | 6/1998 | Yang | 324/525 |
| 5,796,258 A | * | 8/1998 | Yang | 324/522 |
| 5,838,525 A | * | 11/1998 | Ward et al. | 361/69 |
| 5,839,093 A | * | 11/1998 | Novosel et al. | 702/59 |
| 5,929,642 A | * | 7/1999 | Philippot et al. | 324/522 |

FOREIGN PATENT DOCUMENTS

| | | | |
|---|---|---|---|
| DE | 19605022 A1 | * | 7/1997 |
| WO | WO 97/28454 | * | 7/1997 |

OTHER PUBLICATIONS

"New approach to directional fault location for overhead power distribution feeders", Johns et al., IEE Proceedings-C, vol. 138, No. 4, Jul. 1991.*

"Design, Implementation and Testing of an artificial neural network based fault direction discriminator for protecting transmission lines", Sindhu et al., IEEE transactions on power delivery, vol. 10, No. 2, Apr. 1995.*

"Fault location on two terminal transmission lines based on voltages", Zamora et al., IEE Proc.–Gener. Transm. Distrib., vol. 143, No. 1, Jan. 1996.*

* cited by examiner

Primary Examiner—Marc S. Hoff
Assistant Examiner—Carol S Tsai
(74) Attorney, Agent, or Firm—Kirschstein, et al.

(57) ABSTRACT

Faults on power lines are detected by measuring the voltage and current at one end of a power line and using these measurements, together with values of series and shunt parameters of the line, to calculate values of voltage and current at an intermediate point on the line—the so-called "reach point". At least the calculated voltage is used to determine whether a fault lies within a particular zone on the line. The calculation utilizes a value of a derivative of the measured current with respect to time and is able to take into account the sectioning of a line into discrete lengths corresponding to, for example, overhead and cable sections. To increase accuracy, the line or each discrete section of the line is conceptually divided into subsections each having its own parameter values. In a second aspect, detection of whether a fault lies within a particular zone involves the measurement of the voltage and current at one end of the line both before and after the fault, the calculation of a complex impedance between an intermediate point of the line and a reference point, normally earth, the use of these measured values and values relating to line parameters and to a source impedance at the second end of the line, and the determination of the sign of the complex impedance.

19 Claims, 5 Drawing Sheets

FAULT AT REACH POINT

FAULT INSIDE ZONE

FAULT OUTSIDE ZONE

DIRECTIONAL ELEMENT

FAULT-DETECTION FOR POWER LINES

FIELD OF THE INVENTION

The invention relates to a fault-detection apparatus for detecting the presence of a fault in an electrical power line, and in particular, but not exclusively, a multi-phase underground-cable power line and a composite line including an underground-cable power line.

BACKGROUND OF THE INVENTION

Fault-detection arrangements are known in which the line being monitored for faults is modelled simply as series inductance and resistance elements, any shunt capacitance that may exist between the line and any other line or earth being ignored. Such a line will normally be an overhead power line. FIG. 1 shows this scenario, in which a line 10 is considered to have a lumped impedance Z, consisting of an inductive reactance $X_L$ associated with an inductive component L, and a resistance $R_L$ and is monitored in terms of voltage $V_r$ and current $I_r$ at one end of the line. The other end of the line may be connected to a load which may be another AC power connection.

The voltage $V_r$ (known as the "relaying voltage") is related to the current Ir (known as the "relaying current") by the equation:

$$V_r = I_r Z \qquad (1)$$

Since the relaying voltage and current are known by measurement, a value for Z can be calculated and, if the line impedance parameters per unit-length are known, an indication can be derived as to whether the fault lies within the particular section of line being monitored by the relaying equipment.

Discrete signal processing techniques allow calculation of Z in terms of R and L using the equation:

$$v_r = Ri_r + L\frac{di_r}{dt} \qquad (2)$$

The use of the differential equation (2) rather than the phase equation (1) removes the need for the relay input signals $v_r$ and $i_r$ to be at a specified frequency. Thus equation (2) could be equally valid when applied to a 50 Hz or 60 Hz system, so that R and L could in principle be solved over a range of discrete time-signal frequencies of the relay inputs $v_r$ and $i_r$.

The value of shunt capacitance present in overhead lines is sufficiently low to be neglected at power-system frequency so that equation (2) can be used to determine the values of R and L. However, the presence of capacitance causes high-frequency travelling waves to be generated when a fault occurs and these can cause errors in the calculation of R and L. It is therefore necessary to remove the travelling-wave frequencies from the signals $v_r$ and $i_r$ before calculating R and L using equation (2). Since these frequencies are relatively high with respect to the power-system frequency, they can be removed by short-window digital filters without causing the relay operating time to be extended beyond one power-frequency cycle.

On cable circuits, however, the values of shunt capacitance are much greater and the travelling-wave noise is far lower in frequency, so that its effects are less easily removed by filtering. On this basis the values of R and L calculated from equation (2) no longer accurately represent the location of the fault.

SUMMARY OF THE INVENTION

In accordance with the invention, there is provided relay equipment for an electrical power line, characterized by fault-detection means comprising:

a signal-deriving means for deriving first and second signals representative of a voltage and current, respectively, at a first end of said line;

a calculating means for calculating from said first and second signals and from defined values of series and shunt parameters of said line a value of voltage and current associated with a point along said line intermediate said first end and a second end of said line; and a fault-location determining means for determining from said calculated voltage and current values whether a fault lies between said first end and said intermediate point.

The calculating means may calculate said intermediate-point voltage and current values using a value of a derivative of said second signal with respect to time, and preferably employing the matrix relationship:

$$\begin{bmatrix} v_1 \\ i_1 \end{bmatrix} = \begin{bmatrix} 1 & -\left(R_0 + L_0\frac{d}{dt}\right) \\ -C_0\frac{d}{dt} & 1 \end{bmatrix} \begin{bmatrix} v_0 \\ i_0 \end{bmatrix}$$

where $v_1$, $i_1$ are said voltage and current at said intermediate point, $v_0$, $i_0$ are said voltage and current at said first end of the line, $R_0$ and $L_0$ are said series parameters of the line and $C_0$ is a shunt parameter of the line.

The calculating means may be arranged to model said line as a plurality p of line-portions in series having respective series and shunt parameters, said matrix relationship being:

$$\begin{bmatrix} v_1 \\ i_1 \end{bmatrix} = \prod_{m=1}^{p} \begin{bmatrix} 1 & -\left(R_{0m} + L_{0m}\frac{d}{dt}\right) \\ -C_{0m}\frac{d}{dt} & 1 \end{bmatrix} \begin{bmatrix} v_0 \\ i_0 \end{bmatrix}$$

Corresponding parameters of said line-portions may have substantially the same value.

The line may be composed of a plurality q of sections in series having respective series and shunt parameters, each of said plurality q of sections being composed of a plurality p of line-portions in series having respective series and shunt parameters, said matrix relationship being:

$$\begin{bmatrix} v_q \\ i_q \end{bmatrix} = \prod_{n=0}^{q-1} \prod_{m=1}^{p} \begin{bmatrix} 1 & -\left(R_{nm} + L_{nm}\frac{d}{dt}\right) \\ -C_{nm}\frac{d}{dt} & 1 \end{bmatrix} \begin{bmatrix} v_0 \\ i_0 \end{bmatrix}$$

At least the shunt parameters of said sections may not all be of substantially the same value. The sections may correspond to respective distinct forms of line including at least one overhead line section and at least one cable section.

Each of said line or line-portions is preferably modelled by said calculating means as a Γ-network, though a π-network may also be employed.

The fault-location determining means may comprise means for detecting whether said voltage at said intermediate point is zero, positive or negative relative to a reference quantity, a zero result indicating that there is a fault at said intermediate point, a positive result indicating that there is a fault between said point and one end of said line and a negative result indicating that there is a fault between said point and the other end of said line. The reference quantity may be the current associated with said intermediate point.

The calculating means may comprise means for calculating from said calculated voltage and current values a value of a complex impedance between said first end and said intermediate point, and said fault-location determining means may comprise means for evaluating a sign of said complex impedance. The calculating means may calculate said value of a complex impedance by means of the equation:

$$v = Ri + L\frac{di}{dt}$$

where v and i are said intermediate-point voltage and current values, respectively, and R and L are components of said complex impedance.

A negative result may indicate that there is a fault between said intermediate point and said first end of said line and a positive result indicate that there is a fault between said intermediate point and said second end of said line.

The intermediate point will usually lie approximately 80% of the way along said line from said first end of the line.

The signal-deriving means may be adapted to derive said first and second signals both before and after the occurrence of a fault on said line, said calculating means may be adapted to calculate from said pre-fault and post-fault first and second signals and from said parameters and from a value of a source impedance of said second end of said line a change in a value of voltage and current associated with said intermediate point and to calculate from said change a value of a complex impedance existing between said intermediate point and a reference point, and said fault-location determining means may be adapted to determine a sign of an imaginary part of said complex impedance and to infer from said sign a position of said fault relative to said intermediate point.

In accordance with a second aspect of the present invention, a method of determining if a fault on a power line lies within a particular zone of said line comprises the steps of:

measuring a voltage and current at a first end of said line before and after the occurrence of a fault;

calculating the complex impedance between a point on said line intermediate said first end and a second end of the line and a reference point, said complex fault impedance calculation utilizing the measured voltage and current values and values relating to parameters of the line and to a source impedance at said second end of the line;

determining a sign of an imaginary part of said complex impedance; and inferring from said sign a position of said fault relative to said intermediate point on said line.

The inference of said fault position may follow the rule that a negative sign indicates a fault between one of said ends and said intermediate point of said line, a positive sign indicates a fault between the other of said ends and said intermediate point of said line and a zero imaginary part indicates a fault at said intermediate point itself.

The step of calculating the complex impedance may comprise a calculation of the voltage and current at said intermediate point using the equation:

$$\begin{bmatrix} v_1 \\ i_1 \end{bmatrix} = \begin{bmatrix} 1 & -\left(R_0 + L_0\frac{d}{dt}\right) \\ -C_0\frac{d}{dt} & 1 \end{bmatrix} \begin{bmatrix} v_0 \\ i_0 \end{bmatrix}$$

where $v_0$, $i_0$ are the voltage and current at said first end of the line, $v_1$, $i_1$ are the voltage and current at said intermediate point and $R_0$, $L_0$ are series parameters and $C_0$ is a shunt parameter of said line.

The line may be divided into a plurality q of sections and said step of calculating the complex impedance may comprise a calculation of a voltage and current at said intermediate point using the equation:

$$\begin{bmatrix} v_q \\ i_q \end{bmatrix} = \prod_{n=0}^{q-1} \begin{bmatrix} 1 & -\left(R_n + L_n\frac{d}{dt}\right) \\ -C_n\frac{d}{dt} & 1 \end{bmatrix} \begin{bmatrix} v_0 \\ i_0 \end{bmatrix}$$

where $v_0$, $i_0$ are the voltage and current at said first end of the line, $v_q$, $i_q$ are the voltage and current at said intermediate point and $R_n$, $L_n$ are series parameters and $C_n$ is a shunt parameter of respective said sections of the line.

The line or each of said sections may be conceptually subdivided into p line-portions having respective line parameters, and said step of calculating the complex impedance may comprise a calculation of a voltage and current at said intermediate point using the equation:

$$\begin{bmatrix} v_q \\ i_q \end{bmatrix} = \prod_{n=0}^{q-1}\prod_{m=1}^{p} \begin{bmatrix} 1 & -\left(R_{nm} + L_{nm}\frac{d}{dt}\right) \\ -C_{nm}\frac{d}{dt} & 1 \end{bmatrix} \begin{bmatrix} v_0 \\ i_0 \end{bmatrix}$$

The intermediate point may lie approximately 80% of the way along the line from said first end thereof.

BRIEF DESCRIPTION OF THE DRAWINGS

Embodiments of the invention will now be described, by way of example only, with reference to the drawings, of which.

DETAILED DESCRIPTION OF PREFERRED EMBODIMENTS

The present invention takes into account the significant level of shunt capacitance which exists in cable circuits and employs the following relationship between the relaying voltage and current signals:

$$\begin{bmatrix} V_r \\ I_r \end{bmatrix} = \begin{bmatrix} A & B \\ C & D \end{bmatrix} \begin{bmatrix} V_f \\ I_f \end{bmatrix} \quad (3)$$

where A, B, C and D represent the constants of the circuit up to the fault point and $V_f$ and $I_f$ represent the voltage between the faulted point on the line and a reference point, which is normally earth but may alternatively be another phase, and the current through the fault branch, respectively. Constants A, B, C and D would normally be hyperbolically derived for maximum accuracy.

The fundamental difficulty with solving equation (3) is the extra number of variables involved. Although a direct solution is not impossible, it involves very complicated real-time processing. By contrast, if it is assumed that the fault is at a known position—the so-called "reach point" (see later)—calculation of the fault-point voltage and current (i.e. the "reach-point" voltage and current) is considerably facilitated. Thus equation (3) can be recast as:

$$\begin{bmatrix} V_f \\ I_f \end{bmatrix} = \begin{bmatrix} A & B \\ C & D \end{bmatrix}^{-1} \begin{bmatrix} V_r \\ I_r \end{bmatrix} \quad (4)$$

Figure 2:
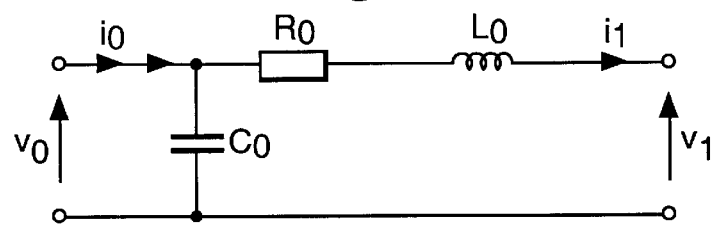
FIG. 2 is an equivalent circuit as in FIG. 1 but with the inclusion of shunt capacitance.

Referring to FIG. 2, this shows a "gamma" (Γ) circuit model of a section of line or cable to be monitored, but a "pi" (π) model could equally well be used. The voltage and current values, $v_1$, $i_1$ at the right hand side of the section are calculated using a knowledge of the voltage and current values, $v_0$, $i_0$ at the left hand side of the section, by the equation:

$$\begin{bmatrix} v_1 \\ i_1 \end{bmatrix} = \begin{bmatrix} 1 & -\left(R_0 + L_0\frac{d}{dt}\right) \\ -C_0\frac{d}{dt} & 1 \end{bmatrix} \begin{bmatrix} v_0 \\ i_0 \end{bmatrix} \quad (5)$$

where $R_0$, $C_0$ and $L_0$ are the resistance, capacitance and inductance values of the circuit section. Again, the differential form of this equation allows the calculation to be made over a range of frequencies and not be restricted to solely the power-system frequency.

Figure 3:
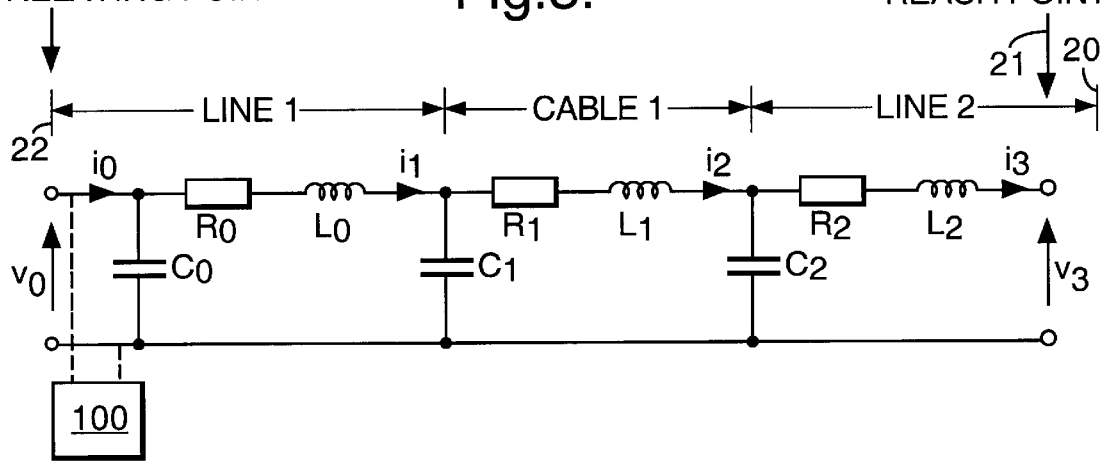
FIG. 3 is an equivalent circuit of a composite power line.

The invention caters also for composite forms of line involving different parameters; an example is where a line takes the form of an overhead stretch of line in one location, continues as a cable section in another location and then becomes overhead again in a third location, and so on. This is shown in FIG. 3. Under these conditions the calculation of the right hand-side voltage and current signals is achieved using:

$$\begin{bmatrix} v_3 \\ i_3 \end{bmatrix} = \begin{bmatrix} 1 & -\left(R_2 + L_2\frac{d}{dt}\right) \\ -C_2\frac{d}{dt} & 1 \end{bmatrix} \begin{bmatrix} 1 & -\left(R_1 + L_1\frac{d}{dt}\right) \\ -C_1\frac{d}{dt} & 1 \end{bmatrix} \quad (6)$$

$$\begin{bmatrix} 1 & -\left(R_0 + L_0\frac{d}{dt}\right) \\ -C_0\frac{d}{dt} & 1 \end{bmatrix} \begin{bmatrix} v_0 \\ i_0 \end{bmatrix}$$

In order to achieve the correct bandwidth of operation and to retain accuracy by more closely approximating a hyperbolic circuit form, a preferred embodiment of the invention divides each circuit section into several cascaded matrices of the form used in equations (5) and (6). Thus, for example, the first matrix on the right hand side of equation (6) can be expressed as (assuming the first overhead line section to be notionally divided into three subsections):

$$\begin{bmatrix} 1 & -\left(R_{2\text{-}1} + L_{2\text{-}1}\frac{d}{dt}\right) \\ -C_{2\text{-}1}\frac{d}{dt} & 1 \end{bmatrix} \begin{bmatrix} 1 & -\left(R_{2\text{-}2} + L_{2\text{-}2}\frac{d}{dt}\right) \\ -C_{2\text{-}2}\frac{d}{dt} & 1 \end{bmatrix} \quad (7)$$

$$\begin{bmatrix} 1 & -\left(R_{2\text{-}3} + L_{2\text{-}3}\frac{d}{dt}\right) \\ -C_{2\text{-}3}\frac{d}{dt} & 1 \end{bmatrix}$$

Figure 4:
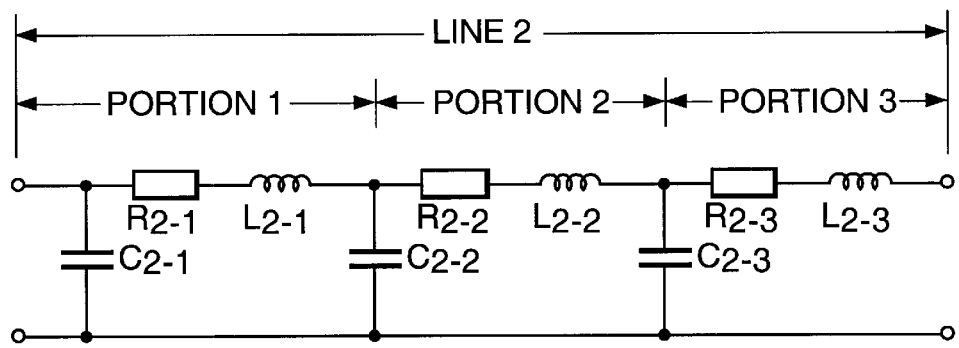
FIG. 4 is an equivalent circuit of one section of the composite power line of FIG. 3, the section being subdivided into subsections.
Figure 5A:
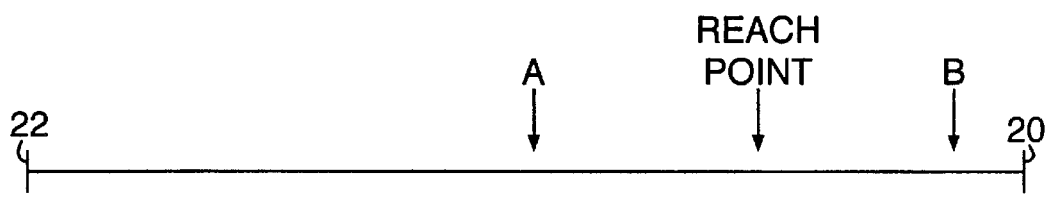
FIG. 5 is a diagram of a voltage characteristic against line length for various positions of fault along the line.
Figure 5B:
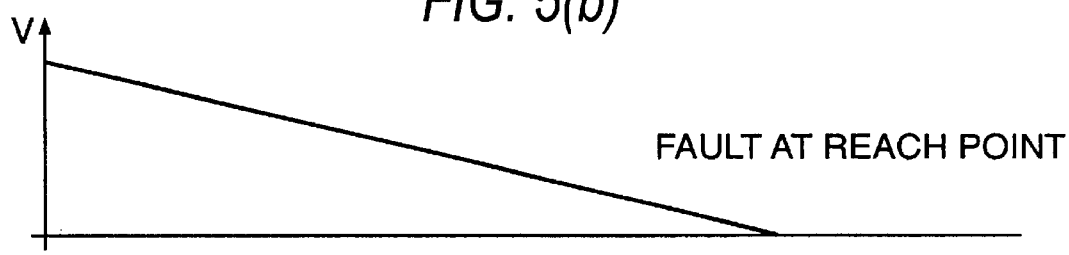
Figure 5C:
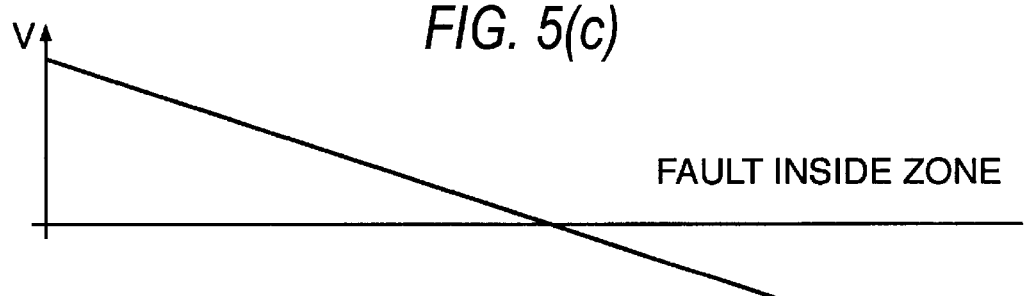
Figure 5D:
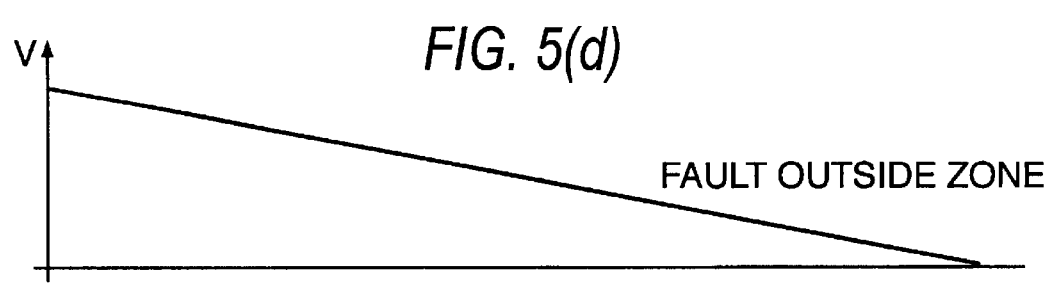

This situation is illustrated in FIG. 4, in which the second overhead line portion (line 2) is represented as being composed of three subsections in series, each having the parameter designations indicated.

An equation of the form of equation (6) in conjunction with the matrix terms (7) allows an accurate discrete-time calculation of the voltage and current at the "reach point". This calculation is valid over a range of frequencies dependent on the number of subsections incorporated. In practice, four or five subsections are sufficient for most ehv (extra-high voltage) composite-circuit applications, and an operating bandwidth of several hundred Hertz is obtainable. Since this calculation obviates the need for filtering over its operating bandwidth, less overall filtering is needed.

A general expression for the case where q line sections (e.g. overhead, cable) are employed, each divided, for the sake of modelling, into p portions or subsections, is:

$$\begin{bmatrix} v_q \\ i_q \end{bmatrix} = \prod_{n=0}^{q-1} \prod_{m=1}^{p} \begin{bmatrix} 1 & -\left(R_{nm} + L_{nm}\frac{d}{dt}\right) \\ -C_{nm}\frac{d}{dt} & 1 \end{bmatrix} \begin{bmatrix} v_0 \\ i_0 \end{bmatrix} \quad (8)$$

The R, L, C parameters will normally be the same within each section, i.e., over the p portions for a particular section. Subdivision into portions applies not only to the case where the line is composed of a number of discrete physical sections, but also to the case where the line is an integral whole, i.e., where q=1.

The "reach point" mentioned earlier is now described with reference to FIG. 3. In FIG. 3 the voltage and current $V_3$, $i_3$ correspond to a point on the line which is somewhat short of the right hand end of the line. In practice the line is usually a section of line under the supervision of relaying equipment 100 at the end 22 of the line section. Relay 100 incorporates the fault-detection means of the present invention, implemented as microprocessor-based computing equipment programmed with the algorithms described herein. Further sections of line may be connected to the end 20 and these may be monitored by other relays. Thus, while the end of the relevant line section is shown as 20, the calculations performed in the relay 100 relate to a point 21 on the line. This is the "reach point" and is typically around 80% of the total line-section length.

It is possible, in the present invention, to differentiate between a fault which occurs at the reach point itself, a fault which occurs between the reach point 21 and the end 20 of the section and a fault which occurs between the relaying end 22 of the section and the reach point 21. Referring to FIG. 5, it is assumed that there is a solid fault (i.e., a fault of substantially zero resistance) either at point A, point B or the reach point 21. Where the fault is at the reach point itself, the calculated voltage is equal to zero. For a fault beyond the reach point, e.g., at point B, the reach-point calculations are correct and show the voltage to have a small positive value. For an in-zone fault, e.g., at point A, the reach-point calculation will be incorrect (inasmuch as the result will not necessarily reflect the true reach-point conditions); however, the voltage will have a small negative value. Under no-fault conditions the reach-point values will be correctly calculated.

The reach-point voltage calculated by this method contains a considerably smaller proportion of travelling-wave frequencies than would be achieved by using a series R-L model. A small degree of filtering then allows phasor techniques to be used to determined the positive/negative nature of the reach-point voltage. A convenient reference phasor for this purpose is the reach-point current. There will be a phase reversal of the reach-point voltage as the location of the fault moves from one side of the reach point to the other. This phase behavior can be determined in practice by calculating the impedance apparent to the reach point using, for example, a solution to equation (2). Thus, if it is imagined that $v_1$, $i_1$ in FIG. 2 represent the reach-point voltage $v_r$ and current $i_r$, respectively, then, taking these quantities to be the values derived by means of, for example, equation (8), a value of R and L can be derived from equation (2) to yield the complex impedance Z. A negative imaginary value of Z will indicate an in-zone fault, whereas a positive imaginary value will signify an out-of-zone fault.

It has so far been assumed that the impedance of the fault will be negligible. This is not always the case, however, and where fault impedance is significant an infeed of current from the remote end 20 of the line section can give rise to misleading indications of fault voltage and current. Because of this it may be necessary to employ some form of relay "characteristic", which will now be described.

Figure 1:
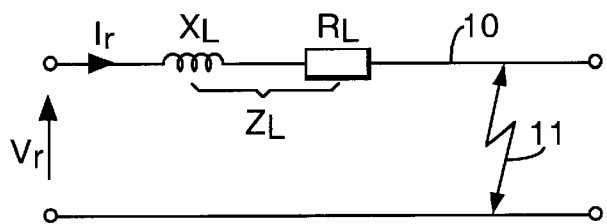
FIG. 1 is an equivalent circuit of a section of power line monitored for faults.
Figure 6:
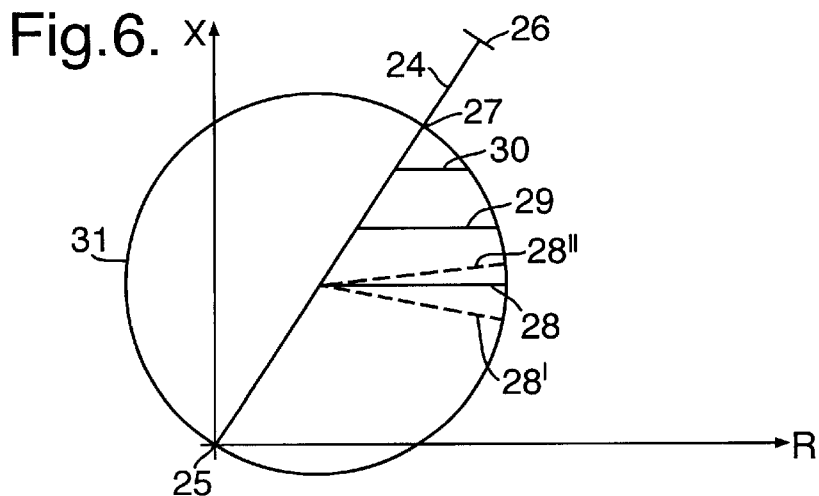
FIG. 6 is a graph showing a first type of relaying characteristic which can be applied to the present invention.

The concept of the relay characteristic is illustrated by reference to FIG. 6. In this diagram the impedance Z (cf. FIG. 1) to the fault is represented by a line 24 situated in the complex R-X plane and having its origin at a point 25 corresponding to the relaying point 22. The impedance equals zero at the relaying point, which is to be expected, and increases to a maximum at a point 26 corresponding to the end 20 of the line section, passing on its way through a value 27 corresponding to the reach-point value. For fault impedances close to zero, Z will be somewhere along the line 24. When the fault has finite resistance, however, the total impedance value will be displaced from the line 24, taking a value along the line 28, for example, for a fault midway between the relaying point and the reach point and having pure resistance and negligible infeed from the remote end of the line section. Other lines 29, 30 relate to similar faults at locations nearer the reach point.

Where fault resistance and remote-end infeed are not negligible, a phase shift is introduced between the current in the fault path and that measured by the relay; hence the line 28, for instance, possesses a reactive component, assuming the orientation shown as dotted line 28' or 28". The former is for power flow from relaying end 22 to remote end 20, the latter for power flow in the reverse direction. At all events, steps are taken to ensure that the relay does not trip the associated circuit breakers when the calculated value of impedance lies outside a locus formed by the circle 31. The X-R values forming this characteristic are simply supplied to the relay processor which then uses a suitable algorithm to effect a comparison between these characteristic values and the calculated values.

Figure 7:
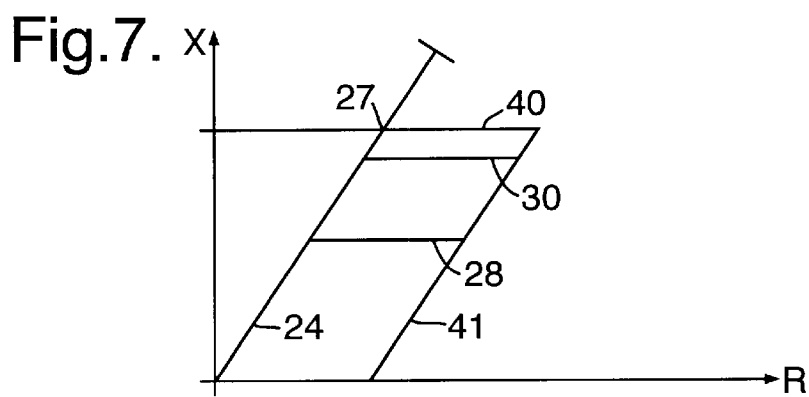
FIG. 7 is a graph showing a second type of relaying characteristic which can be applied to the present invention.

Since the use of a circular characteristic 31 restricts the value of fault resistance that can be tolerated while still being registered as a fault and hence used to trip the circuit breakers (cf. the shortness of line 30 compared with line 28), it is possible to employ a non-circular characteristic allowing for a more uniform fault resistance value. A suitable characteristic is a quadrilateral locus (see FIG. 7) having as its essential elements a straight upper side 40 passing through the reach-point impedance value 27 and a right hand side 41 approximately parallel to the line 24. Thus now lines 28 and 30 can be of equal length and still serve to signal a genuine fault.

For faults occurring close to the relay, the voltage input will be close to zero. Under these circumstances, the relay is unable to differentiate between faults in the protected zone, for which the relay must operate, and faults behind the relay location, where the relay is required to block. To overcome these difficulties the relay is provided with an estimate of the phase of the pre-fault voltage signal so that the direction of the fault can be ascertained; this is referred to as "polarization".

Figure 8:
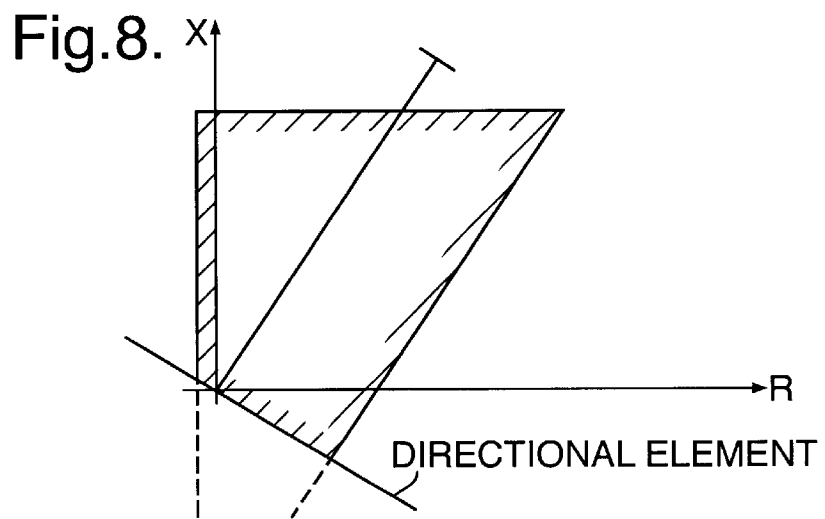
FIG. 8 shows a polarizing characteristic as applicable to the present invention.

Polarization can be achieved by using the voltages from phases not involved in the fault—so-called "sound (i.e., good) phase polarization"—which are vectorially manipulated to give an approximation to the faulted-phase pre-fault voltage. Alternatively, memory polarization, where samples of the pre-fault voltage signal are stored in memory, can be used. The combination of measured and polarized signals is formed into a directional element as shown in the lower line of the quadrilateral of FIG. 8. For either of these approaches, the signals employed for the directional element will be based on the signals at the relay point close to the busbar (i.e., measured signals) and not the reach-point values calculated by means of, for example, equation (8).

In a practical power-line system there may be reactive elements involved apart from the line's own intrinsic series and shunt parameters. Such additional reactive elements include capacitance, which is deliberately included in series with the line in order to compensate the series inductance L of the line, and inductance which is shunted between the line and ground/associated lines in order to compensate for the shunt capacitance C of the line when the line is long. These elements, where they lie within the protected zone of the relay, will tend to affect the accuracy of the reach-point calculations unless they are included in the modelling described earlier. Ideally, therefore, these elements are taken into account in this manner.

Figure 9:
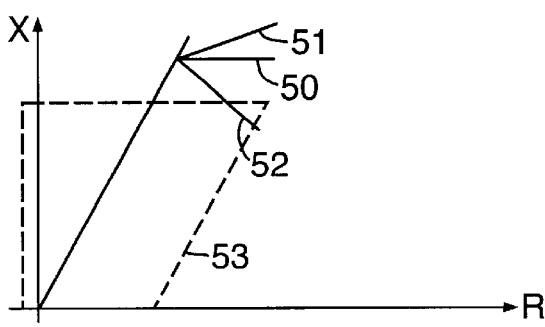
FIG. 9 is a diagram showing the effect of severe remote-end infeed on relaying performance.

As previously stated, when a fault has a significant resistive component any infeed at the remote end of the line section introduces phase shifts which can adversely affect the accuracy of the reach-point voltage and current calculations. In particular, the effect of a change in load can be to trip the relay (i.e., signal a fault) when a fault that has occurred lies in another zone, not the zone protected by the relay in question. This is illustrated by reference to FIG. 9, in which a resistive fault lying outside the protected zone and involving no infeed is shown as line 50, whereas the same fault involving a transfer of power in one direction is shown as line 51 and in the other direction as line 52. Although the fault lies outside the relevant zone, since line 52 passes through the quadrilateral characteristic 53 the relay in question will signal a fault in its zone.

In order to compensate for the effects of infeed on the reliability of the fault detection function, it has been proposed in the past to approximate the current in the fault impedance by employing a model based on symmetrical component sequence networks, in particular a negative sequence network. This model, however, has the drawback of being limited to the fundamental system-frequency only.

The present invention approaches this problem by incorporating in a preferred embodiment an improved reach-point directional element which will now be described.

Figure 10A:
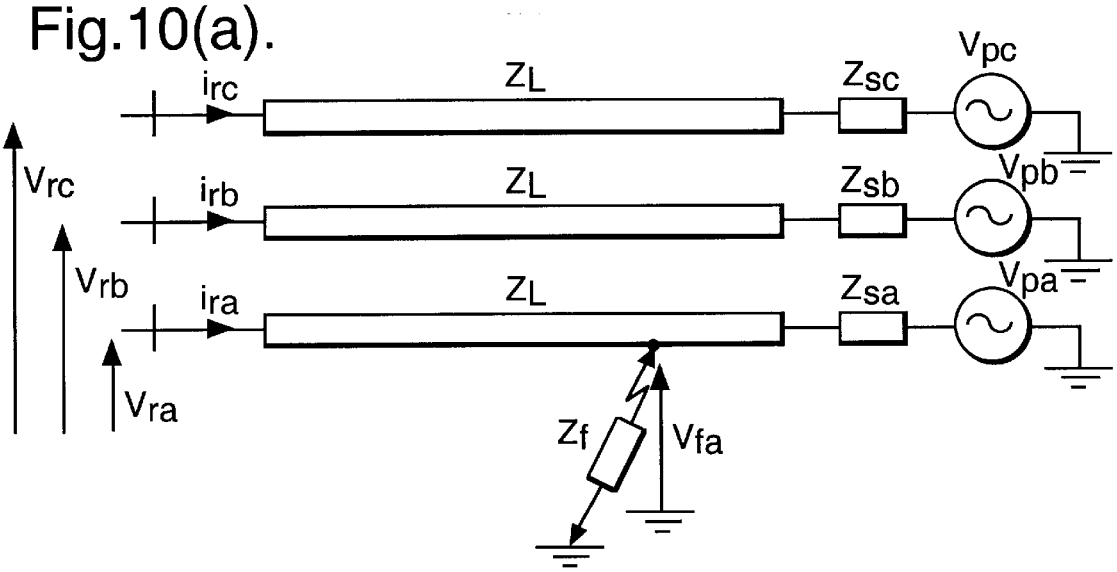
FIGS. 10(a), (b) and (c) are equivalent circuits illustrating the three circuit states associated with a superposition direction-finding technique according to a second aspect of the present invention.
Figure 10B:
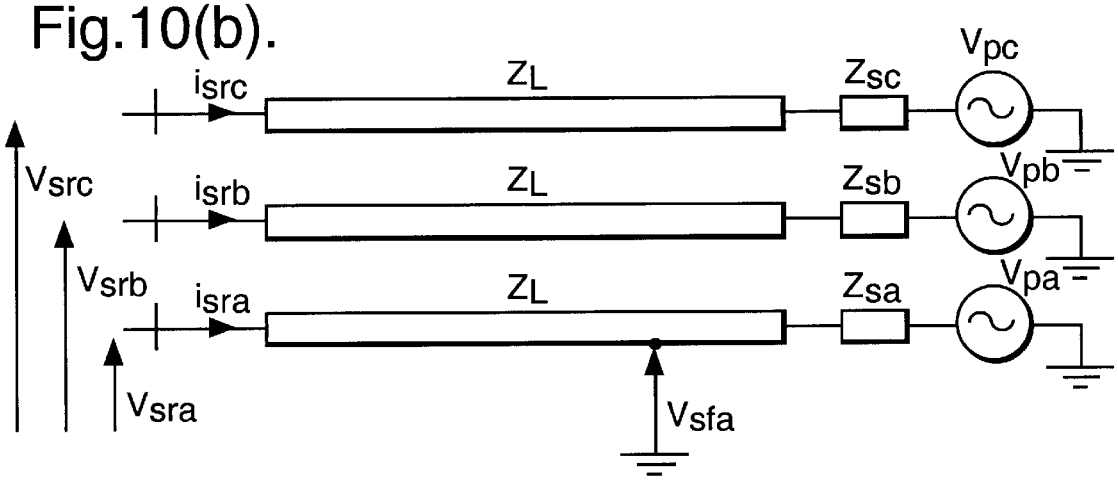

The basic principle of the "superimposition" technique is discussed in the UK Patent GB 2286088B, granted on Sep. 24, 1997. This technique, which in this patent is employed in a context different from that of the present application, namely the determining of the exact location of a fault on a power line, is described here with reference to FIG. 10. FIG. 10a represents a three-phase line under conditions of a fault between phase a and earth, FIG. 10b represents the same three-phase line as it appears just before the fault and FIG. 10c corresponds to the same line in its "superimposed" state, i.e. highlighting those quantities that have changed during the occurrence of the fault. The voltages and currents measured at the relaying end (the lefthand side of the figures) are as designated for all three states, the following relationship holding:

$$\Delta V_{rx} = V_{rx} - V_{srx} \quad (9)$$

where x=a, b or c according to phase.

Figure 10C:
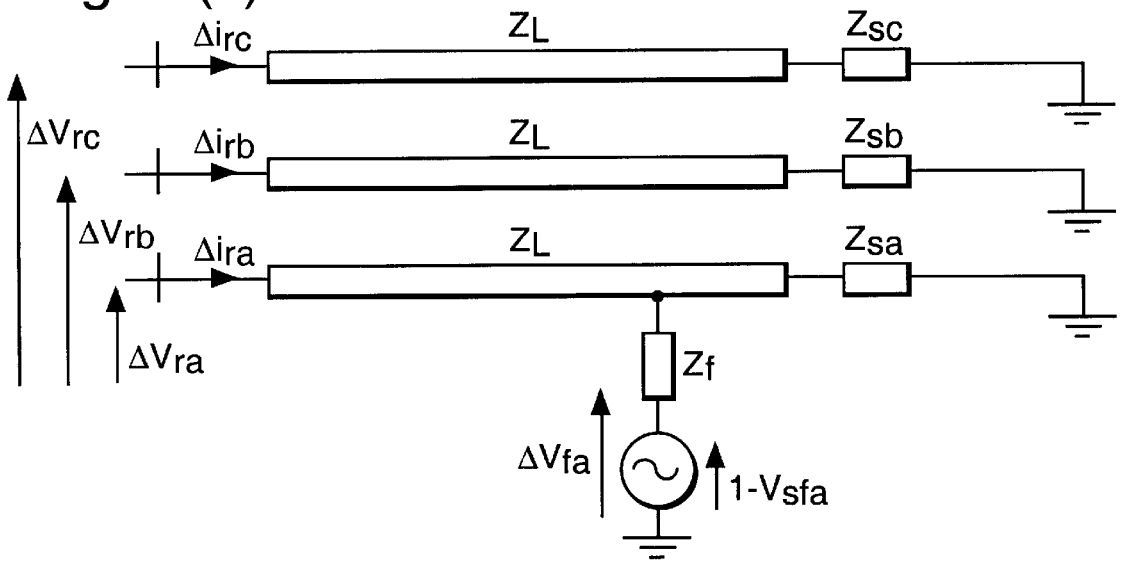

The impedance in the fault path is shown as impedance $Z_f$ and the superposition circuit (FIG. 10(c)) is energized by an emf–$V_{sfa}$ which is the pre-fault voltage at the fault point.

Figure 11:
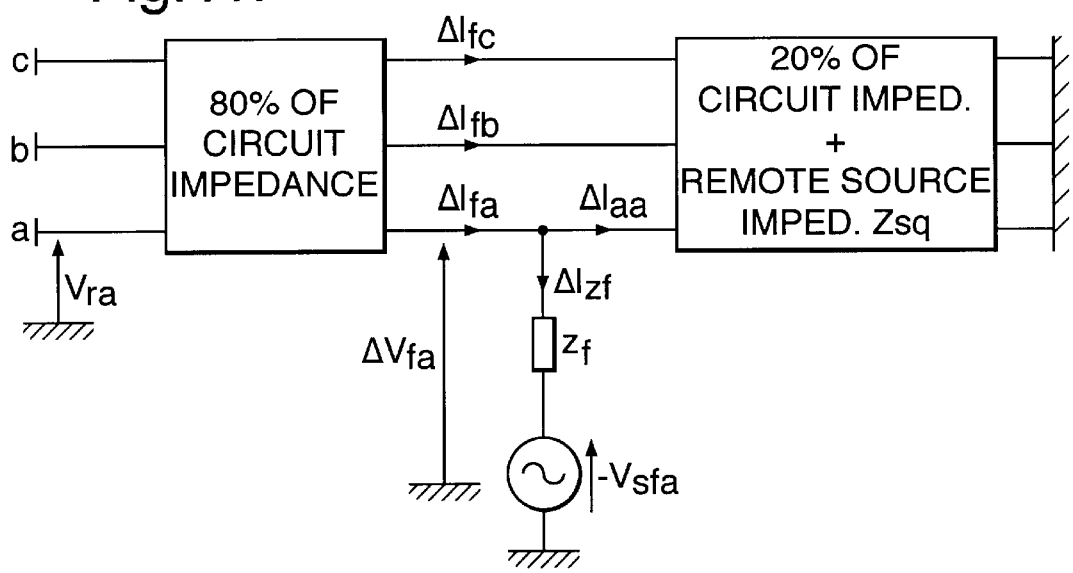
FIG. 11 is an equivalent circuit of a three-phase power line in its superimposed state as applied to a fault-detection arrangement according to the present invention.

The invention applies this superposition principle as shown in FIG. 11. In FIG. 11 the fault point is assumed to be the reach point which is situated, as mentioned earlier, so that approximately 80% of the line impedance lies between the reach point and the relaying end and 20% lies between the reach point and the remote end of the line. Included with the 20% line impedance is the source impedance of the remote source which appears in FIG. 10 as impedances $Z_{sa}$, $Z_{sb}$, $Z_{sc}$. FIG. 11 shows the superimposed state, the various superimposed voltage and current parameters having "Δ" designations.

The superimposed voltages are given by equation (9) above; similarly, the superimposed currents are given by:

$$\Delta I_{rx} = I_{rx} - I_{srx} \quad (10)$$

The reach point superimposed voltage and current values can be similarly calculated using the faulted and pre-fault values from the calculation of equation (6), (7) or (8), as appropriate. Algebraically, the superimposed voltage at the reach point for phase a is:

$$\Delta V_{fa} = V_{fa} - V_{sfa} \quad (11)$$

and likewise, mutatis mutandis for the other phases. As far as the superimposed currents are concerned, we have:

$$\Delta I_{fa} = I_{ra} - I_{sra}$$

$$\Delta I_{fb} = I_{rb} - I_{srb}$$

$$\Delta I_{fc} = I_{rc} - I_{src} \quad (12)$$

The unknown quantities in FIG. 11 are $Z_f$, $Z_{sq}$ and $\Delta I_{aa}$. $Z_f$ can be calculated from:

$$Z_f = \frac{\Delta V_{fa} + V_{sfa}}{\Delta I_{Z_f}} = \frac{\Delta V_{fa} + V_{sfa}}{\Delta I_{fa} - \Delta I_{aa}} \quad (13)$$

Assuming that the remote source impedance $Z_{sq}$ is known, $\Delta I_{aa}$ is calculated from:

$$\begin{bmatrix} \Delta I_{aa} \\ \Delta I_{fb} \\ \Delta I_{fc} \end{bmatrix} = \begin{bmatrix} Z_s & Z_{subm} & Z_m \\ Z_m & Z_s & Z_m \\ Z_m & Z_m & Z_s \end{bmatrix}^{-1} \begin{bmatrix} \Delta V_{fa} \\ \Delta V_{fb} \\ \Delta V_{fc} \end{bmatrix} \quad (14)$$

where $Z_s$ and $Z_m$ are the self and mutual impedances of the circuit section between the reach point and the remote end and including the assumed value of the remote source impedance. Since high-resistance earth faults are only likely where the reach point is on an overhead line rather than cable, the discrete time calculation of $\Delta I_{aa}$ can be made by representing $Z_s$, $Z_m$ as series resistance and inductance elements only, i.e. by using models of the form of equation (2) rather than equation (6) or (8). $Z_f$ is calculated by substitution of the value derived for $\Delta I_{aa}$ from equation (14) into equation (13).

The behavior of $Z_f$ can be summarized as follows:

| Fault Position | Re{$Z_f$} | Im{$Z_f$} | Remarks |
|---|---|---|---|
| In-zone | Pos. or Neg. | Negative | — |
| Reach point | Pos. or zero | Zero | Re{$Z_f$} = true fault resistance |
| Out-of-zone | Positive | Positive | — |

Thus, it is possible to use the change in sign of the imaginary component of $Z_f$ as the basis for a directional decision, i.e., whether a fault is in- or out-of-zone. Furthermore, since the superimposed network is not influenced by prefault loading, discrimination of the reach point will not be affected by fault resistance, as it is affected in the conventional methods of direction evaluation described earlier. Hence there is no need to perform any check on the superimposed reach-point resistance, or to evaluate it at all. Investigations have shown that for ehv applications the assumed value of the remote source impedance can vary by an order of magnitude without significantly affecting the accuracy of the relay. Further to this, in equation (14) the quantities $\Delta I_{fb}$, $\Delta I_{fc}$, $\Delta V_{fa}$, $\Delta V_{fb}$ and $\Delta V_{fc}$ are all known from the reach-point calculation. Hence equation (14) could be solved for $Z_s$ and $Z_m$ (the impedance to the right of the fault in FIG. 11). In principle, the accuracy of the relaying process can be improved by using calculated values of $Z_s$ and $Z_m$ rather than the assumed values described earlier.

Figure 12:
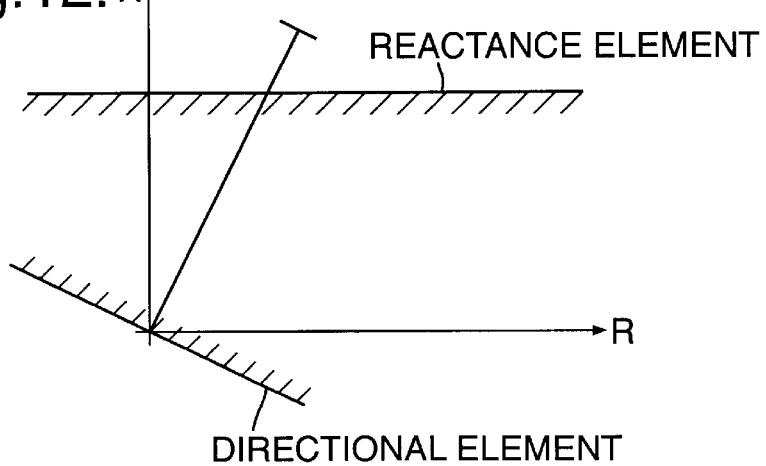
FIG. 12 is a diagram showing a characteristic achieved by the superposition directional technique in the second aspect of the present invention.

The effect of the superimposition technique just described is to provide a characteristic such as that shown in FIG. 12, in which the righthand line, which normally limits the allowed value of fault resistance, is missing.

Although the superimposed reach-point technique has been described in connection with the specific line protection arrangement according to the invention, it is envisaged that it could also be employed with more conventional relaying techniques such as that described in the opening part of the present specification.

Also, whereas the faults covered in the description of the superimposition direction-finding technique according to the invention were assumed to be faults from line to earth, in principle the method could also cover faults between phases.

I claim:
1. Relay equipment for an electrical power line, comprising:
   a fault-detection apparatus including
   a) a signal-deriving means for deriving first and second signals representative of a voltage and current, respectively, at a first end of said line;
   b) a calculating means for calculating, from said first and second signals and from defined values of series and shunt parameters of said line, a value of voltage and current associated with a point along said line intermediate said first end and a second end of said line, said calculating means being operative for calculating said voltage and current values at said intermediate point in a calculation using a value of a derivative of said second signal with respect to time on the basis of the matrix relationship:

$$\begin{bmatrix} v_1 \\ i_1 \end{bmatrix} = \begin{bmatrix} 1 & -\left(R_0 + L_0\frac{d}{dt}\right) \\ -C_0\frac{d}{dt} & 1 \end{bmatrix} \begin{bmatrix} v_0 \\ i_0 \end{bmatrix}$$

where $v_1$, $i_1$ are said voltage and current at said intermediate point, $v_0$, $i_0$ are said voltage and current at said first end of the line, $R_0$ and $L_0$ are said series parameters of the line and $C_0$ is a shunt parameter of the line; and
   c) a fault-location determining means for determining from said calculated voltage and current values where a fault lies relative to said intermediate point.

2. Relay equipment as claimed in claim 1, wherein said calculating means is arranged to model said line as a plurality p of line-portions in series having respective series and shunt parameters, said matrix relationship being:

$$\begin{bmatrix} v_1 \\ i_1 \end{bmatrix} = \prod_{m=1}^{p} \begin{bmatrix} 1 & -\left(R_{0m} + L_{0m}\frac{d}{dt}\right) \\ -C_{0m}\frac{d}{dt} & 1 \end{bmatrix} \begin{bmatrix} v_0 \\ i_0 \end{bmatrix}.$$

3. Relay equipment as claimed in claim 2, wherein corresponding parameters of said line-portions have substantially the same value.

4. Relay equipment as claimed in claim 2, wherein said line is modeled as a plurality q of sections in series having respective series and shunt parameters, each of said plurality q of sections being composed of a plurality p of line-portions in series having respective series and shunt parameters, said matrix relationship being:

$$\begin{bmatrix} v_q \\ i_q \end{bmatrix} = \prod_{n=0}^{q-1}\prod_{m=1}^{p} \begin{bmatrix} 1 & -\left(R_{nm} + L_{nm}\frac{d}{dt}\right) \\ -C_{nm}\frac{d}{dt} & 1 \end{bmatrix} \begin{bmatrix} v_0 \\ i_0 \end{bmatrix}.$$

5. Relay equipment as claimed in claim 4, wherein at least the shunt parameters of said sections are not all of substantially the same value.

6. Relay equipment as claimed in claim 5, wherein said sections correspond to respective distinct forms of line including at least one overhead line section and at least one cable section.

7. Relay equipment as claimed in claim 2, wherein said line or each said line-portion is modeled by said calculating means as a Γ-network.

8. Relay equipment as claimed in claim 2, wherein said line or each said line-portion is modeled by said calculating means as a π-network.

9. Relay equipment as claimed in claim 1, wherein said fault-location determining means comprises means for detecting whether said voltage at said intermediate point is zero, positive or negative relative to a reference quantity, a zero result indicating that there is a fault at said intermediate point, a positive result indicating that there is a fault between said point and one end of said line and a negative result indicating that there is a fault between said point and the other end of said line.

10. Relay equipment as claimed in claim 9, wherein said reference quantity is the current value associated with said intermediate point.

11. Relay equipment as claimed in claim 1, wherein said signal-deriving means is adapted to derive said first and second signals both before and after the occurrence of the fault on said line; wherein said calculating means is adapted to calculate, from said pre-fault and post-fault occurrences, first and second signals and, from said parameters and from a value of a source impedance of said second end of said line, a change in a value of voltage and current associated with said intermediate point and to calculate, from said change, a value of a complex impedance existing between said intermediate point and a reference point; and wherein said fault-location determining means is adapted to determine a sign of an imaginary part of said complex impedance and to infer from said sign a position of said fault relative to said intermediate point.

12. Relay equipment for an electrical power line, comprising:
   a fault-detection apparatus including
   a) a signal-deriving means for deriving first and second signals representative of a voltage and current, respectively, at a first end of said line;
   b) a calculating means for calculating, from said first and second signals and from defined values of series and shunt parameters of said line, a value of voltage and current associated with a point along said line intermediate said first end and a second end of said line, said calculating means being operative for calculating from said calculated voltage and current values a value of a complex impedance between said first end and said intermediate point by means of the equation:

$$v = Ri + L\frac{di}{dt}$$

where v and i are said intermediate-point voltage and current values, respectively, and R and L are components of said complex impedance; and
   c) a fault-location determining means for determining from said calculated voltage and current values where a fault lies relative to said intermediate point, said fault-location determining means comprising means for evaluating a sign of said complex impedance.

13. A Relay equipment as claimed in claim 12, wherein a negative result for the sign indicates that there is a fault between said intermediate point and said first end of said line, and a positive result for the sign indicates that there is a fault between said intermediate point and said second end of said line.

14. Relay equipment as claimed in claim 13, wherein said intermediate point lies approximately 80% of the way along said line from said first end of the line.

15. Method of determining if a fault on a power line lies within a particular zone of said line, comprising the steps of:
   a) measuring voltage and current values at a first end of said line before and after the occurrence of said fault;
   b) calculating a complex impedance between a point on said line intermediate said first end and a second end of the line and a reference point by utilizing the measured voltage and current values and values relating to parameters of the line and to a source impedance at said second end of the line using the equation:

$$\begin{bmatrix} v_1 \\ i_1 \end{bmatrix} = \begin{bmatrix} 1 & -\left(R_0 + L_0 \frac{d}{dt}\right) \\ -C_0 \frac{d}{dt} & 1 \end{bmatrix} \begin{bmatrix} v_0 \\ i_0 \end{bmatrix}$$

where $v_0$, $i_0$ are the voltage and current at said first end of the line, $v_1$, $i_1$ are the voltage and current at said intermediate point, and $R_0$, $L_0$ are series parameters and $C_0$ is a shunt parameter of said line;
   c) determining a sign of an imaginary part of said complex impedance; and
   d) inferring from said sign a position of said fault relative to said intermediate point on said line.

16. Method as claimed in claim 15, wherein said step of inferring said fault position is performed by inferring said position of said fault to lie between one of said ends and said intermediate point of said line when the sign is negative, inferring said position of said fault to lie between the other of said ends and said intermediate point of said line when the sign is positive, and inferring said position of said fault to lie at said intermediate point when said sign is zero.

17. Method as claimed in claim 15, wherein said line is divided into a plurality q of sections and said step of calculating the complex impedance comprises a calculation of a voltage and current at said intermediate point using the equation:

$$\begin{bmatrix} v_q \\ i_q \end{bmatrix} = \prod_{n=0}^{q-1} \begin{bmatrix} 1 & -\left(R_n + L_n \frac{d}{dt}\right) \\ -C_n \frac{d}{dt} & 1 \end{bmatrix} \begin{bmatrix} v_0 \\ i_0 \end{bmatrix}$$

where $v_0$, $i_0$ are the voltage and current at said first end of the line, $v_q$, $i_q$ are the voltage and current at said intermediate point, and $R_n$, $L_n$ are series parameters and $C_n$ is a shunt parameter of respective said sections of the line.

18. Method as claimed in claim 17, wherein said line or each of said sections is conceptually subdivided into a plurality p of line-portions having respective line parameters, and said step of calculating the complex impedance comprises a calculation of a voltage and current at said intermediate point using the equation:

$$\begin{bmatrix} v_q \\ i_q \end{bmatrix} = \prod_{n=0}^{q-1} \prod_{m=1}^{p} \begin{bmatrix} 1 & -\left(R_{nm} + L_{nm} \frac{d}{dt}\right) \\ -C_{nm} \frac{d}{dt} & 1 \end{bmatrix} \begin{bmatrix} v_0 \\ i_0 \end{bmatrix}.$$

19. Method as claimed in claim 15, wherein said intermediate point lies approximately 80% of the way along the line from said first end thereof.

* * * * *